US012684865B2

(12) United States Patent (10) Patent No.: US 12,684,865 B2
Matsumoto (45) Date of Patent: Jul. 14, 2026

(54) SEMICONDUCTOR DEVICE

(71) Applicant: ROHM CO., LTD., Kyoto (JP)

(72) Inventor: Yuji Matsumoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 333 days.

(21) Appl. No.: 18/460,273

(22) Filed: Sep. 1, 2023

(65) Prior Publication Data

US 2024/0096890 A1 Mar. 21, 2024

(30) Foreign Application Priority Data

Sep. 20, 2022 (JP) ................................. 2022-148940

(51) Int. Cl.
H10D 84/85 (2025.01)
H10D 62/13 (2025.01)
H10D 62/17 (2025.01)
H10D 64/27 (2025.01)

(52) U.S. Cl.
CPC ......... H10D 84/856 (2025.01); H10D 62/151 (2025.01); H10D 62/235 (2025.01); H10D 64/519 (2025.01)

(58) Field of Classification Search
CPC ... H10D 84/856; H10D 62/151; H10D 64/519
See application file for complete search history.

(56) References Cited

U.S. PATENT DOCUMENTS

2004/0251492 A1* 12/2004 Lin .................... H10D 30/0285
257/E21.345
2006/0071273 A1* 4/2006 Hiroki ................. H10D 64/111
257/E29.027

2013/0153956 A1* 6/2013 Shi ........................ H10D 86/201
257/140
2014/0339637 A1* 11/2014 Jang ..................... H10D 62/371
438/286
2017/0194489 A1* 7/2017 Park ..................... H10D 62/151

FOREIGN PATENT DOCUMENTS

JP 2005-510080 A 4/2005

OTHER PUBLICATIONS

Office Action issued for corresponding Japanese patent application No. 2022-148940, and its English translation, dated Apr. 16, 2026.

* cited by examiner

*Primary Examiner* — Brian Turner
(74) *Attorney, Agent, or Firm* — Rabin & Berdo, P.C.

(57) ABSTRACT

A semiconductor device includes: a chip having a main surface; a trench insulation structure that defines an active region in the main surface; a first conductivity type well region formed in the active region; a second conductivity type first impurity region formed in the well region; a second impurity region formed in the well region and surrounding the first impurity region in a plan view; a gate electrode formed on the well region between the first impurity region and the second impurity region, and surrounding the first impurity region in a plan view; a gate insulating film formed between the gate electrode and the well region; a gate contact portion formed on the trench insulation structure; and a gate connection portion that crosses the second impurity region from a boundary between the trench insulation structure and the active region and connects the gate contact portion and the gate electrode.

15 Claims, 14 Drawing Sheets

SEMICONDUCTOR DEVICE

CROSS-REFERENCE TO RELATED APPLICATION

This application is based upon and claims the benefit of priority from Japanese Patent Application No. 2022-148940, filed on Sep. 20, 2022, the entire contents of which are incorporated herein by reference.

TECHNICAL FIELD

The present disclosure relates to a semiconductor device.

BACKGROUND

For example, a method of limiting formation of divots in a shallow trench isolation (STI) structure is known. The method includes a step of providing an oxide deposited in a trench formed in a silicon region, a step of forming a thermal oxide layer on an upper surface of the silicon region by oxidizing an upper layer of the silicon region, and a step of selectively etching the thermal oxide with respect to the deposited oxide.

BRIEF DESCRIPTION OF DRAWINGS

The accompanying drawings, which are incorporated in and constitute a part of the specification, illustrate embodiments of the present disclosure.

FIG. 6 is an enlarged view of a portion surrounded by two-dot chain line VI in FIG. 5.

FIG. 14 is a schematic cross-sectional view showing a portion of a semiconductor device according to a seventh embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Next, embodiments of the present disclosure will be described in detail with reference to the accompanying drawings.

Hereinafter, an arrangement direction of a plurality of transistors is defined as a first direction X, a direction perpendicular to the arrangement direction is defined as a second direction Y, and a thickness direction of a chip 2 is defined as a third direction Z. The definitions of the first direction X, the second direction Y, and the third direction Z are not limited thereto.

<<Overview of Semiconductor Device 1>>

Figure 1:
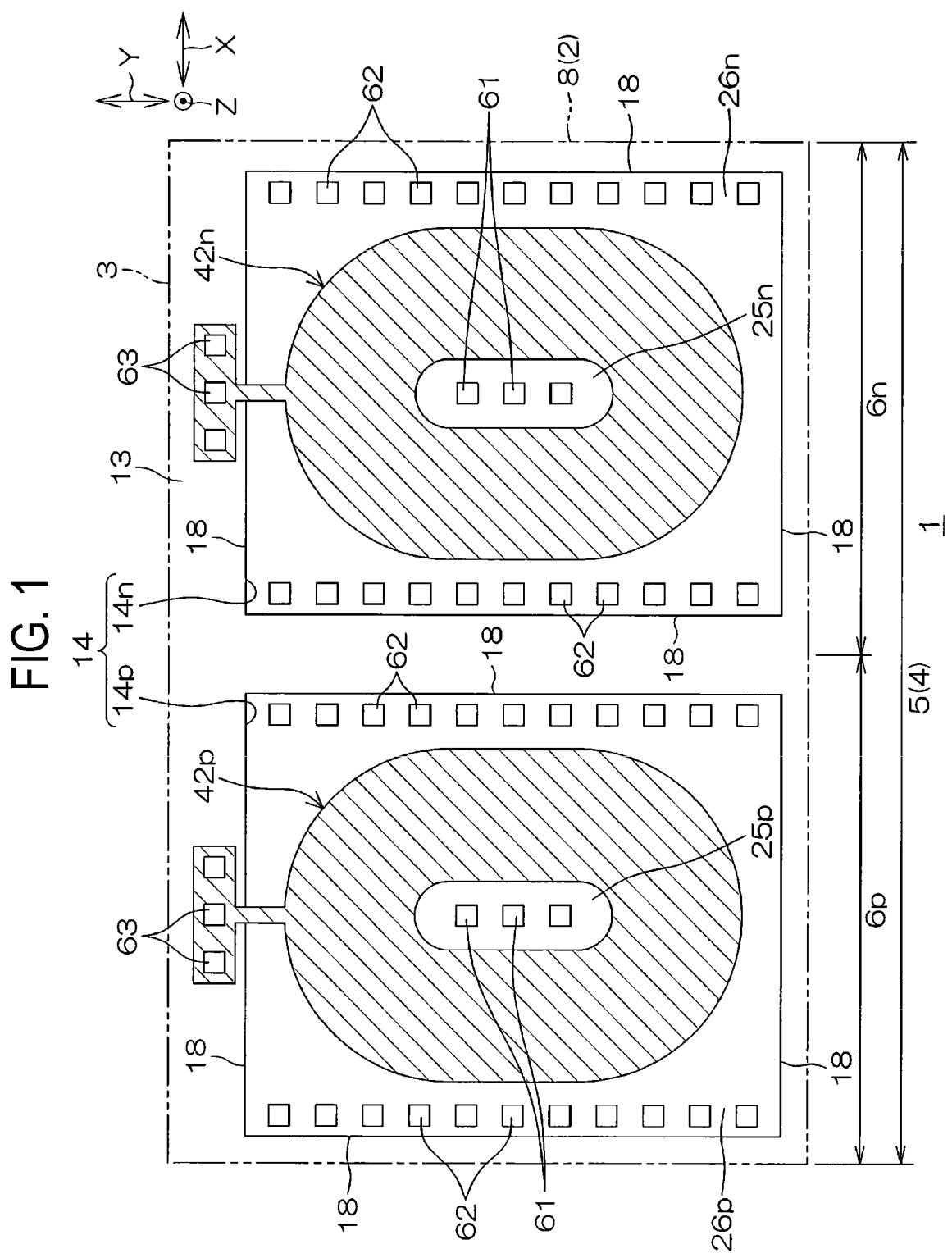
FIG. 1 is a schematic plan view of a semiconductor device according to a first embodiment of the present disclosure.

FIG. 1 is a schematic plan view of a semiconductor device 1 according to a first embodiment of the present disclosure. Referring to FIG. 1, the semiconductor device 1 is, for example, a composite element in which a plurality of elements is mounted on the common chip 2, and includes a CMOS region 3. CMOS transistors 4 are formed in the CMOS region 3.

Although not shown in FIG. 1, in addition to the CMOS region 3, the chip 2 may be formed with, for example, a DMOS region in which DMOS transistors are formed, a bipolar region in which bipolar transistors are formed, a passive element region in which passive elements such as resistance elements and capacitors are formed, and the like.

As the CMOS transistors 4, for example, a low-breakdown voltage CMOS transistor 5, an intermediate-breakdown voltage CMOS transistor, and a high-breakdown voltage transistor may be formed in the CMOS region 3. The low-breakdown voltage CMOS transistor 5 may be, for example, a CMOS transistor having a rated voltage of 1.0 V or more and 4.0 V or less. The intermediate-breakdown voltage CMOS transistor may be, for example, a CMOS transistor having a rated voltage of 4.0 V or more and 7.0 V or less. The high-breakdown voltage CMOS transistor may be, for example, a CMOS transistor having a rated voltage of 7 V or more and 60 V or less. The rated voltage may be defined as the maximum allowable range of a voltage applied between a source and a drain of each CMOS transistor. In addition, the rated voltage of each CMOS transistor may be rephrased as a breakdown voltage of each CMOS transistor 4.

In the following, a structure of the low-breakdown voltage CMOS transistor 5, particularly a structure of a low-breakdown voltage p-type channel transistor 6p, will be described in detail. However, the structure of the low-breakdown voltage p-type channel transistor 6p can also be applied to a low-breakdown voltage n-type channel transistor 6n, an intermediate-breakdown voltage CMOS transistor, and a high-breakdown voltage CMOS transistor.

<<Structure of Low-Breakdown Voltage P-type Channel Transistor 6p>>

Figure 2:
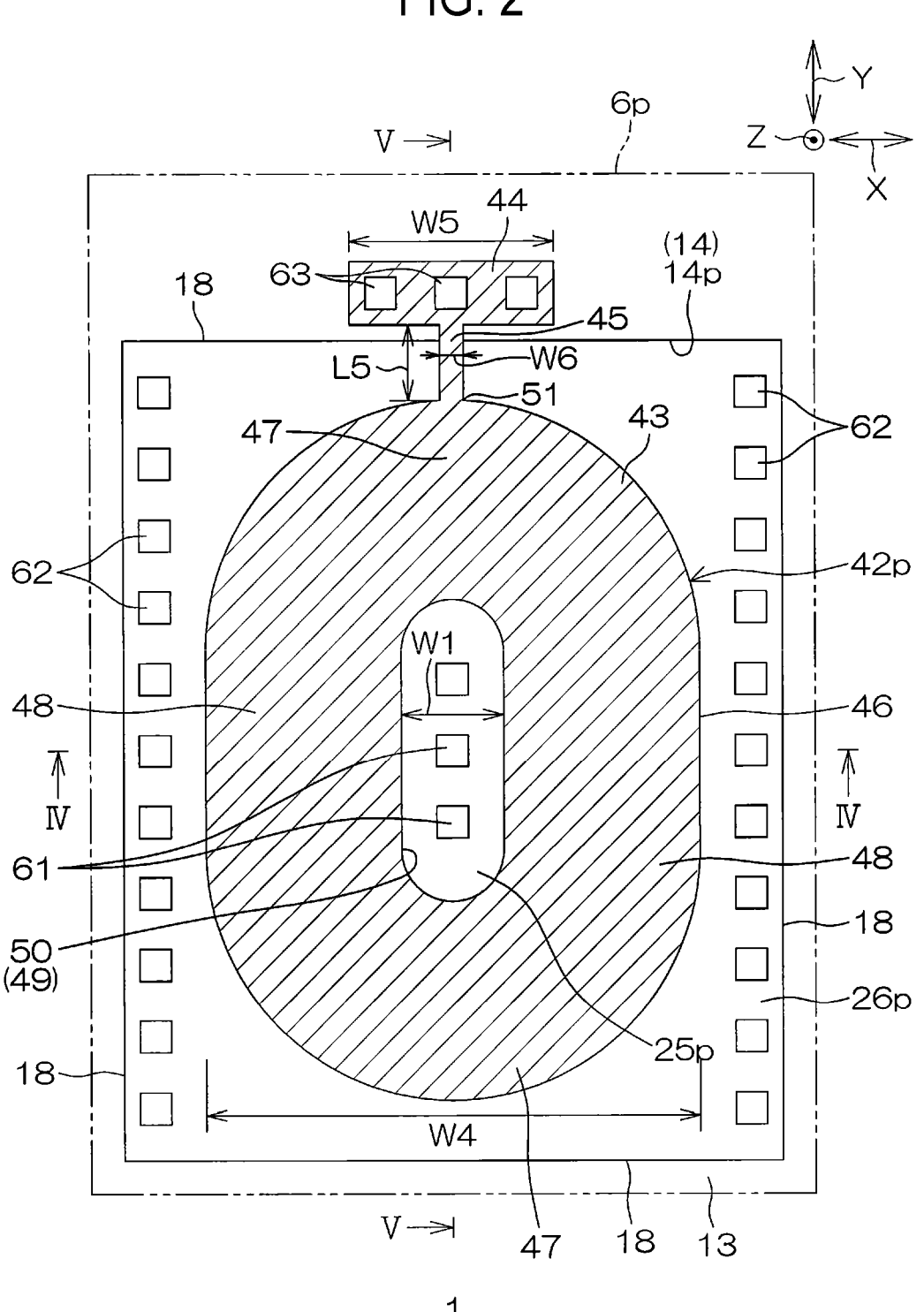
FIG. 2 is an enlarged plan view of the semiconductor device of FIG. 1.
Figure 3:
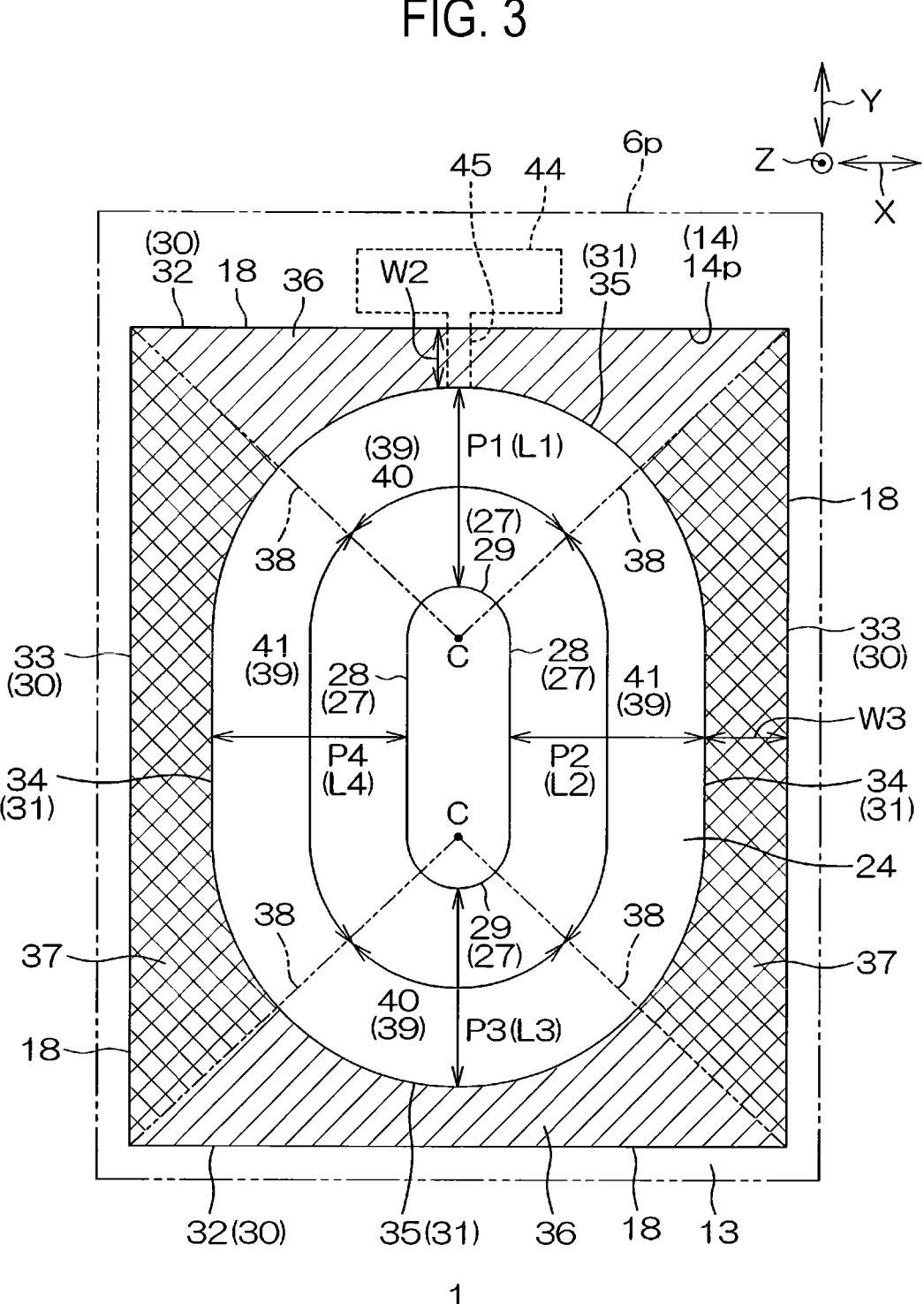
FIG. 3 is a view showing the semiconductor device of FIG. 2 from which a gate electrode and the like are removed.
Figure 4:
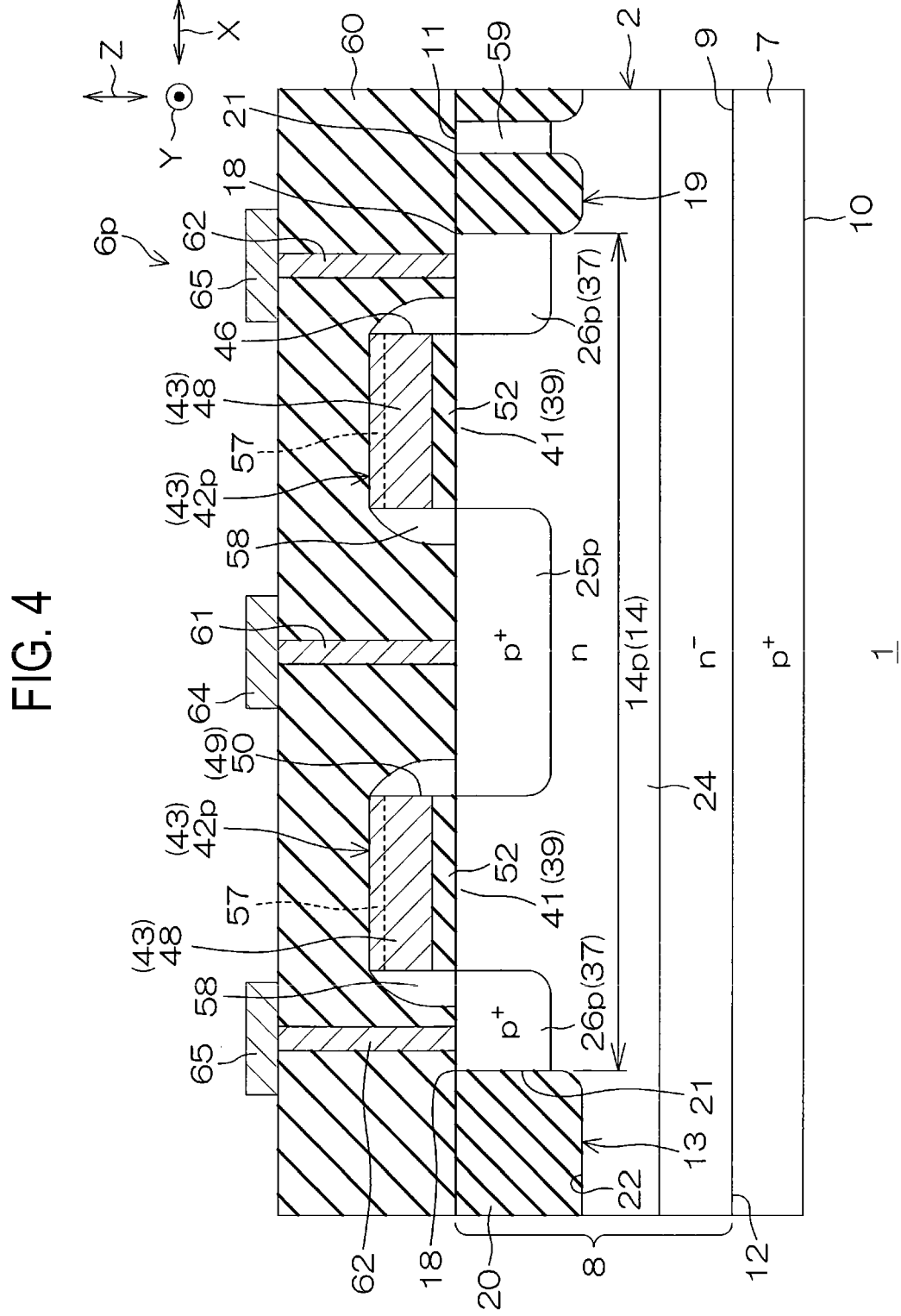
FIG. 4 is a cross-sectional view taken along line IV-IV in FIG. 2.
Figure 5:
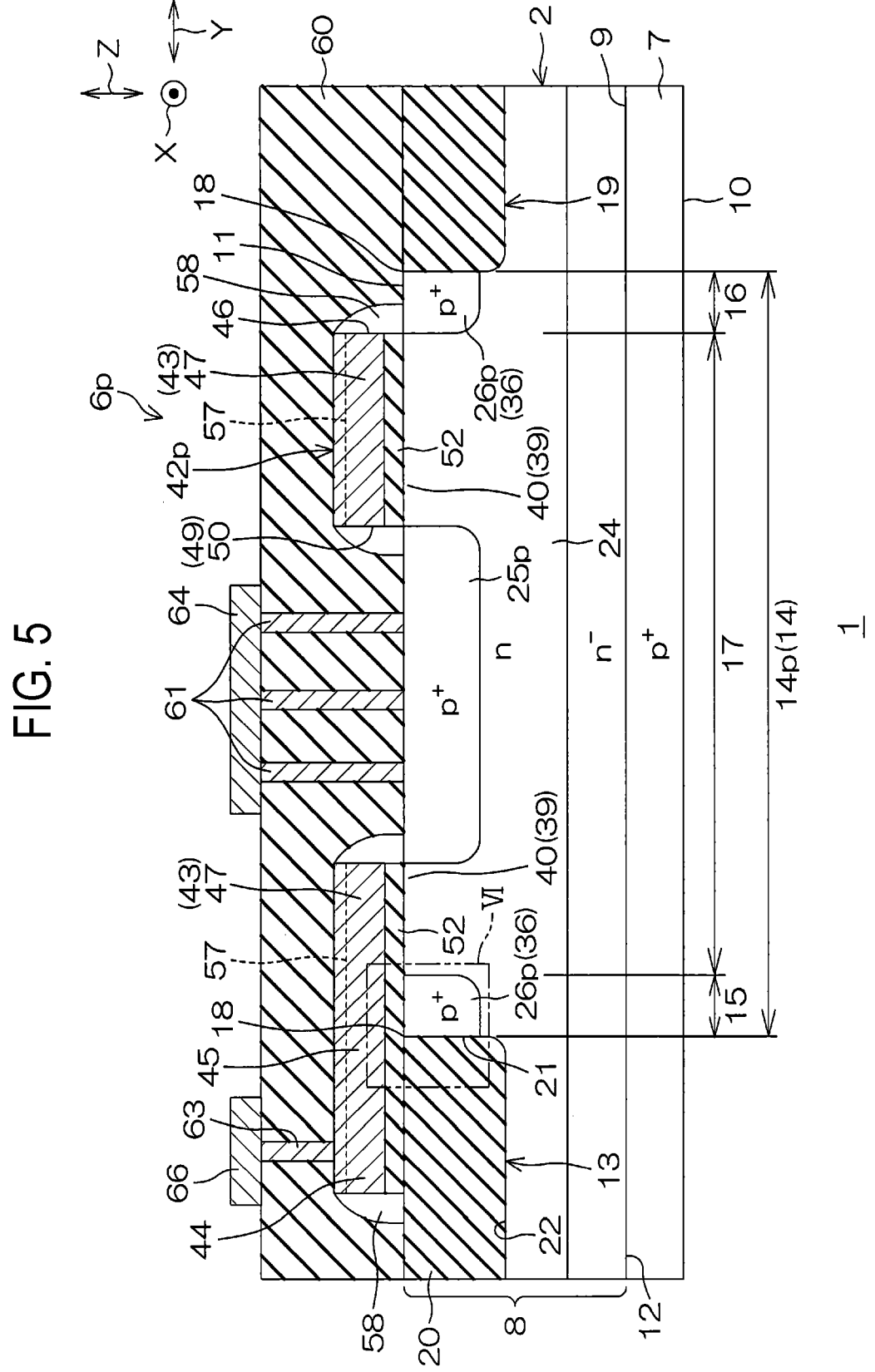
FIG. 5 is a cross-sectional view taken along line V-V in FIG. 2.
Figure 6:
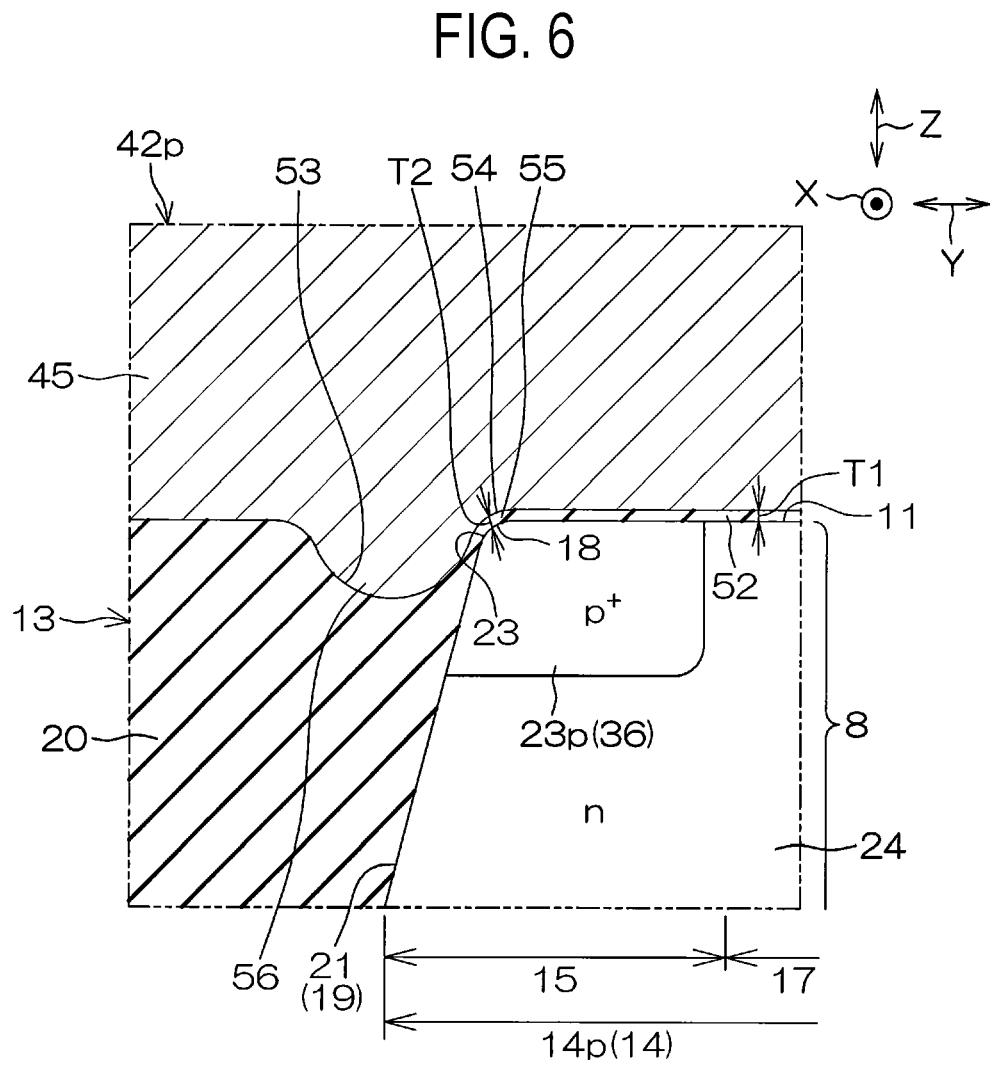

FIG. 2 is an enlarged plan view of the semiconductor device 1 of FIG. 1. FIG. 3 is a view of the semiconductor device 1 of FIG. 2 in which a p-side planar gate structure 42p is removed. FIG. 4 is a cross-sectional view taken along line IV-IV in FIG. 2. FIG. 5 is a cross-sectional view taken along line V-V in FIG. 2. FIG. 6 is an enlarged view of a portion surrounded by two-dot chain line VI in FIG. 5.

As described above, the low-breakdown voltage CMOS transistor 5 includes the low-breakdown voltage p-type channel transistor 6p and the low-breakdown voltage n-type channel transistor 6n. The low-breakdown voltage p-type channel transistor 6p and the low-breakdown voltage n-type channel transistor 6n are formed on the common chip 2.

Referring to FIGS. 4 and 5, in the present embodiment, the chip 2 may include a semiconductor substrate 7 and an epitaxial layer 8. The semiconductor substrate 7 may be a p-type silicon substrate. An impurity concentration of the semiconductor substrate 7 may be, for example, $1.0 \times 10^{13}$ cm$^{-3}$ or more and $1.0 \times 10^{20}$ cm$^{-3}$ or less. The semiconductor substrate 7 has a first main surface 9 and a second main surface 10 opposite to the first main surface 9. The first main surface 9 and the second main surface 10 may also be rephrased as a front surface and a back surface of the semiconductor substrate 7, respectively. Symbols "p$^+$", "p$^-$", "n$^+$", "n", and "n$^-$" in the drawings of the present application merely indicate a relative magnitude relationship between impurity regions (semiconductor regions) containing p-type impurities or n-type impurities for the sake of convenience, and do not define a impurity concentration in a specific range.

The epitaxial layer 8 is formed on the semiconductor substrate 7. In the present embodiment, the epitaxial layer 8 may be an n-type silicon semiconductor layer. An impurity concentration of the epitaxial layer 8 may be, for example, $1.0 \times 10^{13}$ cm$^{-3}$ or more and $1.0 \times 10^{17}$ cm$^{-3}$ or less. The epitaxial layer 8 may have a first main surface 11 and a second main surface 12 opposite to the first main surface 11. The first main surface 11 and the second main surface 12 may also be rephrased as a front surface and a back surface of the epitaxial layer 8, respectively. The second main surface 12 of the epitaxial layer 8 may be a bonding surface with the first main surface 9 of the chip 2.

Referring to FIGS. 1 to 6, the epitaxial layer 8 is formed with a trench insulation structure 13 that partitions a region on the first main surface 11 into a plurality of active regions. The trench insulation structure 13 may be referred to as an element isolator. Referring to FIG. 1, the trench insulation structure 13 defines an LV-active region 14 for the low-breakdown voltage CMOS transistor 5 in the first main surface 11 of the epitaxial layer 8. The LV-active region 14 includes a p-side active region 14p for the low-breakdown voltage p-type channel transistor 6p and an n-side active region 14n for the low-breakdown voltage n-type channel transistor 6n.

The p-side active region 14p and the n-side active region 14n are adjacent to each other in the first direction X across the trench insulation structure 13. The p-side active region 14p and the n-side active region 14n may be formed in rectangular shapes of the same size elongated in the second direction Y when viewed from the normal direction of the first main surface 11.

Referring to FIG. 5, p-side active region 14p may have a first end portion 15 on one side, a second end portion 16 on the opposite side, and a central portion 17 between the first end portion 15 and the second end portion 16 in the second direction Y. There may be no clear boundaries between the first and second end portions 15 and 16 and the central portion 17.

For example, in the p-side active region 14p, a region occupied by a p-type drain region 26p to be described later may be the first end portion 15 and the second end portion 16, and a region surrounded by the p-type drain region 26p may be the central portion 17. In addition, portions extending inward in the second direction Y by a range of 0.1 μm or more and 1.0 μm or less from a boundary 18 between the p-side active region 14p and the trench insulation structure 13 may be the first end portion 15 and the second end portion 16, and the other portion may be the central portion 17.

Referring to FIGS. 4 to 6, in the present embodiment, the trench insulation structure 13 includes a trench 19 formed in the epitaxial layer 8, and a buried insulator 20 buried in the trench 19.

The trench 19 has a sidewall 21 and a bottom wall 22. The sidewall 21 of the trench 19 may be a surface which is perpendicular to the first main surface 11 of the epitaxial layer 8, as shown in FIGS. 4 and 5, or may be a surface which is inclined with respect to the first main surface 11 of the epitaxial layer 8, as shown in FIG. 6. In the case of FIG. 6, the trench 19 may have a tapered shape in which a width thereof decreases toward the bottom wall 22 in the third direction Z from the first main surface 11, when viewed in cross section.

The buried insulator 20 may be, for example, silicon oxide (SiO$_2$), silicon nitride (SiN), or the like. In the present embodiment, the buried insulator 20 consists of silicon oxide. The buried insulator 20 exposes an open end portion 23 of the trench 19. The trench insulation structure 13 may also be called STI (Shallow Trench Isolation) as a general name.

An n-type well 24 for the low-breakdown voltage p-type channel transistor 6p is formed in a surface layer portion of the epitaxial layer 8. An impurity concentration of the n-type well 24 is higher than the impurity concentration of the epitaxial layer 8, and may be, for example, $1.0 \times 10^{17}$ cm$^{-3}$ or more and $1.0 \times 10^{19}$ cm$^{-3}$ or less. The low-breakdown voltage p-type channel transistor 6p is formed in the n-type well 24.

A p-type source region 25p (first impurity region) and a p-type drain region 26p (second impurity region) are formed at an interval from each other in a surface layer portion of the n-type well 24. Impurity concentrations of the p-type source region 25p and the p-type drain region 26p are higher than the impurity concentration of the n-type well 24, and may be, for example, $1.0 \times 10^{19}$ cm$^{-3}$ or more and $1.0 \times 10^{21}$ cm$^{-3}$ or less. The p-type source region 25p and the p-type drain region 26p are formed at the same depth from the first main surface 11. The p-type drain region 26p is in contact with the buried insulator 20 of the trench insulation structure 13 over an entire depth direction of the epitaxial layer 8 from the first main surface 11. Further, in FIG. 1, as a structure of the low-breakdown voltage n-type channel transistor 6n, an n-type source region 25n and an n-type drain region 26n that correspond to the p-type source region 25p and the p-type drain region 26p, respectively, are shown.

Referring to FIG. 3, the p-type source region 25p is formed in an inner region spaced apart from an outer peripheral edge of the n-type well 24. The p-type source region 25p may be formed inward from the boundary 18 between the trench insulation structure 13 and the p-side active region 14p with an interval. The p-type source region 25p has an outer peripheral edge 27, an entire circumference of which is spaced inward from the boundary 18.

In the present embodiment, the p-type source region 25p is formed in an elongated shape in the second direction Y in a plan view. More specifically, the p-type source region 25p is formed in a substantially elliptical shape elongated in the second direction Y in a plan view. The outer peripheral edge 27 of the p-type source region 25p may include a pair of linear portions 28 extending in parallel along the second direction Y and a pair of curved portions 29 extending along the first direction X and connecting end portions of the pair of linear portions 28 to each other. Referring to FIG. 2, a width W1 of the p-type source region 25*p* in the first direction X may be, for example, 3 μm or more and 10 μm or less.

The p-type drain region 26*p* is formed to be spaced outward from the outer peripheral edge 27 of the p-type source region 25*p* and surround the p-type source region 25*p* in a plan view. The p-type drain region 26*p* may be a region that occupies a predetermined width inward from the boundary 18 between the trench insulation structure 13 and the p-side active region 14*p*. In the present embodiment, the p-type drain region 26*p* is formed in an endless annular shape surrounding the p-type source region 25*p* in a plan view.

Referring to FIG. 3, the p-type drain region 26*p* has an outer peripheral edge 30 forming the boundary 18 and an inner peripheral edge 31 facing the outer peripheral edge 27 of the p-type source region 25*p* with an interval. An annular region sandwiched between the outer peripheral edge 30 and the inner peripheral edge 31 is the p-type drain region 26*p*. The outer peripheral edge 30 of the p-type drain region 26*p* is formed in a rectangular annular shape elongated in the second direction Y in a plan view. The outer peripheral edge 30 of the p-type drain region 26*p* may include a pair of first linear portions 32 extending in parallel along the first direction X and a pair of second linear portions 33 extending in parallel along the second direction Y and connecting end portions of the pair of first linear portions 32 to each other.

The inner peripheral edge 31 of the p-type drain region 26*p* is formed in a substantially elliptical annular shape elongated in the second direction Y in a plan view. The inner peripheral edge 31 of the p-type drain region 26*p* may include a pair of linear portions 34 extending in parallel along the second direction Y and a pair of curved portions 35 extending along the first direction X and connecting end portions of the pair of linear portions 34 to each other. The inner peripheral edge 31 of the p-type drain region 26*p* may be similar in shape to the outer peripheral edge 27 of the p-type source region 25*p*.

Therefore, when lines perpendicular to the outer peripheral edge 27 are drawn between the outer peripheral edge 27 of the p-type source region 25*p* and the inner peripheral edge 31 of the p-type drain region 26*p*, lengths of the lines may be equal. In FIG. 3, lines perpendicular to the pair of linear portions 28 and the pair of curved portions 29 of the p-type source region 25*p* include perpendicular lines P1, P2, P3, and P4. Respective lengths L1, L2, L3, and L4 of the perpendicular lines P1, P2, P3, and P4 are equal to one another.

The p-type drain region 26*p* may include a pair of first portions 36 and a pair of second portions 37. The pair of first portions 36 and the pair of second portions 37 are regions occupying a predetermined area of the surface layer portion of the n-type well 24 and are combined to form the p-type drain region 26*p*. The first portion 36 and the second portion 37 may be referred to as a first region and a second region, respectively, or may be referred to as a first area and a second area, respectively. In FIG. 3, the pair of first portions 36 is diagonally hatched, and the pair of second portions 37 is cross-hatched.

The pair of first portions 36 are portions of the p-type drain region 26*p* formed along the pair of first linear portions 32, and the pair of second portions 37 are portions of the p-type drain region 26*p* formed along the pair of second linear portions 33. There is no clear boundary between the first portion 36 and the second portion 37, but it may be defined, for example, by a line perpendicular to the curved portion 35 of the inner peripheral edge 31. As another definition method, for example, as shown in FIG. 3, a boundary between the first portion 36 and the second portion 37 may be defined by an imaginary boundary line 38 drawn from a center C of a circle of each curved portion 29 of the outer peripheral edge 27 on the source side to an intersection of the first linear portion 32 and the second linear portion 33 of the outer peripheral edge 30 on the drain side. In the present embodiment, since the curved portion 29 on the source side and the curved portion 35 on the drain side are semicircles that are similar to each other, the imaginary boundary line 38 drawn from the center C is a line perpendicular to the curved portion 35 on the drain side.

The pair of first portions 36 sandwich the p-type source region 25*p* with an interval in the second direction Y and face each other via the p-type source region 25*p*. Each first portion 36 is formed along the first direction X and may be a region sandwiched between the first linear portion 32 of the p-type drain region 26*p* and the curved portion 35 on the drain side in the second direction Y. A width W2 of each first portion 36 in the second direction Y (for example, a distance between the curved portion 35 on the drain side and the first linear portion 32 on the drain side) may be, for example, 0.1 μm or more and 1.0 μm or less.

The pair of second portions 37 sandwich the p-type source region 25*p* with an interval in the first direction X and face each other via the p-type source region 25*p*. Each second portion 37 is formed along the second direction Y and may be a region sandwiched between the second linear portion 33 of the p-type drain region 26*p* and the linear portion 34 on the drain side in the first direction X. A width W3 of each second portion 37 in the first direction X (for example, a distance between the linear portion 34 on the drain side and the second linear portion 33 on the drain side) may be, for example, 0.4 μm or more and 1.5 μm or less.

A region in the n-type well 24 sandwiched between the p-type source region 25*p* and the p-type drain region 26*p* is a channel region 39 where a channel of a transistor is formed. Referring to FIG. 3, the channel region 39 is formed to surround the p-type source region 25*p* in a plan view. In the present embodiment, the channel region 39 is formed in a substantially elliptical annular shape elongated in the second direction Y and surrounding the p-type source region 25*p*.

The channel region 39 may include a first channel region 40 and a second channel region 41. In the present embodiment, one first channel region 40 is formed on each of one side and the other side of the p-type source region 25*p* in the second direction Y, and one second channel region 41 is formed on each of one side and the other side of the p-type source region 25*p* in the first direction X. That is, the channel region 39 may include a pair of first channel regions 40 and a pair of second channel regions 41.

The pair of first channel regions 40 are portions of the channel region 39 formed along the first direction X, and the pair of second channel regions 41 are portions of the channel region 39 formed along the second direction Y. There is no clear boundary between the first channel region 40 and the second channel region 41, but it may be defined, for example, by a line perpendicular to the curved portion 29 of the outer peripheral edge 27. As another definition method, for example, as shown in FIG. 3, a boundary between the first channel region 40 and the second channel region 41 may be defined by the above-mentioned imaginary boundary line 38.

The first channel region 40 may be a region sandwiched between the curved portion 35 on the drain side and the curved portion 29 on the source side in the second direction Y. The second channel region 41 may be a region sandwiched between the linear portion 34 on the drain side and the linear portion 28 on the source side in the first direction X.

In the present embodiment, the inner peripheral edge 31 of the p-type drain region 26p is formed over the entire circumference at an equal distance from the outer peripheral edge 27 of the p-type source region 25p. Thus, a channel length of the first channel region 40 and a channel length of the second channel region 41 are equal or substantially equal to each other. "Substantially equal" means that there is a slight error between the channel length of the first channel region 40 and the channel length of the second channel region 41, which may be generated during a manufacturing process of the semiconductor device 1. In FIG. 3, the channel length of the first channel region 40 may be the lengths L1 and L3 of the above-mentioned perpendicular lines P1 and P3, and the channel length of the second channel region 41 may be the lengths L2 and L4 of the above-mentioned perpendicular lines P2 and P4.

A p-side planar gate structure 42p is formed in the first main surface 11 of the epitaxial layer 8 in the p-side active region 14p. In FIG. 1, as a structure of the low-breakdown voltage n-type channel transistor 6n, an n-side planar gate structure 42n corresponding to the p-side planar gate structure 42p is shown. The p-side planar gate structure 42p is formed on the first main surface 11 to cover the channel region 39. Referring to FIG. 2, the p-side planar gate structure 42p integrally includes a gate electrode 43 that controls on/off of the channel region 39, a gate contact portion 44 that receives a voltage supply, and a gate connection portion 45 that connects the gate contact portion 44 and the gate electrode 43.

Referring to FIG. 2, the gate electrode 43 is entirely formed in the p-side active region 14p. The gate electrode 43 has an outer peripheral edge 46 spaced inward from the boundary 18. The gate electrode 43 is formed on the channel region 39. Similarly to the channel region 39, the gate electrode 43 is formed to surround the p-type source region 25p in a plan view. In the present embodiment, the gate electrode 43 is formed in a substantially elliptical annular shape elongated in the second direction Y and surrounding the p-type source region 25p. The gate electrode 43 may include a pair of curved portions 47 facing the pair of first channel regions 40 and a pair of linear portions 48 facing the pair of second channel regions 41.

A gate opening 50 defined by an inner peripheral edge 49 of the gate electrode 43 is formed in a central portion of the gate electrode 43. The p-type source region 25p is exposed through the gate opening 50. The gate opening 50 is formed in a substantially elliptical shape in a plan view. Referring to FIGS. 4 and 5, the p-type source region 25p may be formed in a self-aligned manner with respect to the inner peripheral edge 49 of the gate electrode 43, and the p-type drain region 26p may be formed in a self-aligned manner with respect to the outer peripheral edge 46 of the gate electrode 43.

The gate contact portion 44 is formed on the trench insulation structure 13 and faces the gate electrode 43 with an interval from the boundary 18. The gate contact portion 44 is, for example, arranged with an interval from the gate electrode 43 in the first direction X or the second direction Y. In the present embodiment, the gate contact portion 44 is selectively arranged on one side of the gate electrode 43 in the second direction Y. A width W5 of the gate contact portion 44 in the first direction X may be narrower than a width W4 of the gate electrode 43 in the first direction X.

Although not shown, the gate contact portion 44 may be formed to surround the p-side active region 14p.

The gate connection portion 45 extends from the boundary 18 between the trench insulation structure 13 and the p-side active region 14p, and is connected to the gate electrode 43 across the p-type drain region 26p. Referring to FIG. 3, in the present embodiment, the gate connection portion 45 selectively crosses one first portion 36 of the pair of first portions 36 and the pair of second portions 37 of the p-type drain region 26p.

A connection position of the gate connection portion 45 in the gate electrode 43 is not particularly limited. In some embodiments, as shown in FIG. 2, the gate connection portion 45 may be connected to a top portion 51 of the curved portion 47 of the gate electrode 43 (an outermost portion of the curved portion 47 in the second direction Y). With this configuration, since it is possible to connect the gate contact portion 44 and the gate electrode 43 with the shortest distance, a voltage drop caused by the gate connection portion 45, which is a resistance component, can be suppressed. For example, a length L5 of the gate connection portion 45 may be 0.3 μm or more and 1.2 μm or less.

The gate connection portion 45 has a width W6 narrower than the width W1 of the p-type source region 25p in a direction (the first direction X in FIG. 2) perpendicular to a direction (the second direction Y in FIG. 2) in which the gate connection portion 45 crosses the p-type drain region 26p. Since the width W1<the width W4 and the width W1<the width W5, the width W6 of the gate connection portion 45 is narrower than the width W4 of the gate electrode 43 and the width W5 of the gate contact portion 44. The width W6 of the gate connection portion 45 may be, for example, 0.08 μm or more and 0.3 μm or less. In addition, the width W5 may be, for example, 0.3 μm or more.

A gate insulating film 52 is formed between the p-side planar gate structure 42p and the first main surface 11. The gate insulating film 52 may include a silicon oxide film. The gate insulating film 52 may include a silicon oxide film made of oxide of the epitaxial layer 8.

A cross-sectional structure of the p-side planar gate structure 42p at the first end portion 15 and the second end portion 16 of the p-side active region 14p will be described in detail with reference to FIG. 6. FIG. 6 shows, as an example, a structure at the first end portion 15 of the first end portion 15 and the second end portion 16, but the structure of the first end portion 15 can also be applied to the second end portion 16. In addition, the structure of the first end portion 15 can also be applied to both end portions of the p-side active region 14p in the first direction X.

A recess 53 is selectively formed in the buried insulator 20 in a vicinity of the first end portion 15 of the p-side active region 14p. The recess 53 is a recess that is generated due to a cleaning process (such as light etching using a hydrofluoric acid solution) performed each time before a thermal oxidation process of forming the gate insulating film 52. The recess 53 may be referred to as a divot. This recess 53 may be formed continuously over an entire circumference of the p-side active region 14p to surround the p-side active region 14p.

The gate insulating film 52 covers the open end portion 23 of the trench 19 so as to be integrally connected to the buried insulator 20 in the recess 53. At a boundary portion 54 between the buried insulator 20 in a vicinity of the recess 53 and the gate insulating film 52, a remarkably thin film portion 55 is generated in the gate insulating film 52. For example, a thickness T1 of the gate insulating film 52 in the central portion 17 is 50 angstroms or more and 250 angstroms or less, and a thickness T2 of the thin film portion 55 is smaller than the thickness T1 of the gate insulating film 52 in the central portion 17. The thin film portion 55 may cause a leakage and a decrease in breakdown voltage of the gate insulating film 52. In addition, the thin film portion 55 partially forms a low-threshold value region, causing deterioration of static characteristics of the low-breakdown voltage p-type channel transistor 6p (e.g., a threshold value becomes unstable). Therefore, the present embodiment provides a structure in which the deterioration of the static characteristics does not occur.

The gate connection portion 45 covers the boundary portion 54 and the recess 53 of the buried insulator 20, and may include a buried portion 56 buried in the recess 53. Thus, in the first end portion 15 of the p-side active region 14p, the gate connection portion 45 straddles both of a side of the trench insulation structure 13 and a side of the p-side active region 14p side with respect to the boundary portion 54.

Referring to FIGS. 4 and 5, a silicide 57 is formed on a surface layer portion on a side of an upper surface of the p-side planar gate structure 42p. The silicide 57 is integrally formed over an entirety of the p-side planar gate structure 42p.

A sidewall 58 is formed around the p-side planar gate structure 42p. The sidewall 58 is formed continuously over an entire circumference of the p-side planar gate structure 42p to cover a side surface of the p-side planar gate structure 42p. The sidewall 58 may be, for example, silicon oxide (SiO₂), silicon nitride (SiN), or the like.

An n-type back gate region 59 is formed in a surface layer portion of the n-type well 24. The n-type back gate region 59 is electrically connected to the n-type well 24. In FIG. 1, the n-type back gate region 59 is omitted.

An interlayer insulating film 60 is formed in the first main surface 11 of the epitaxial layer 8. The interlayer insulating film 60 may be, for example, silicon oxide (SiO₂), silicon nitride (SiN), or the like. In the present embodiment, the interlayer insulating film 60 is made of silicon oxide.

A source contact 61, a drain contact 62, and a gate contact 63 are formed in the interlayer insulating film 60. These contacts 61 to 63 are buried in the interlayer insulating film 60. The contacts 61 to 63 may be, for example, a metallic material such as tungsten (W). Referring to FIG. 2, a plurality of source contacts 61 and a plurality of drain contacts 62 are respectively formed at intervals from one another along the second direction Y. A plurality of gate contacts 63 are formed at intervals from one another along the first direction X.

Referring to FIGS. 4 and 5, a source wiring 64, a drain wiring 65, and a gate wiring 66 are formed on the interlayer insulating film 60. The wirings 64 to 66 may be, for example, a metallic material such as aluminum (Al). The source wiring 64 is electrically connected to the p-type source region 25p via the source contact 61. The drain wiring 65 is electrically connected to the p-type drain region 26p via the drain contact 62. The gate wiring 66 is electrically connected to the p-side planar gate structure 42p (the gate contact portion 44) via the gate contact 63.

<<Effects of Semiconductor Device 1>>

Next, technical effects of the semiconductor device 1 will be described based on a comparison between the semiconductor device 1 and a semiconductor device 81.

Figure 7:
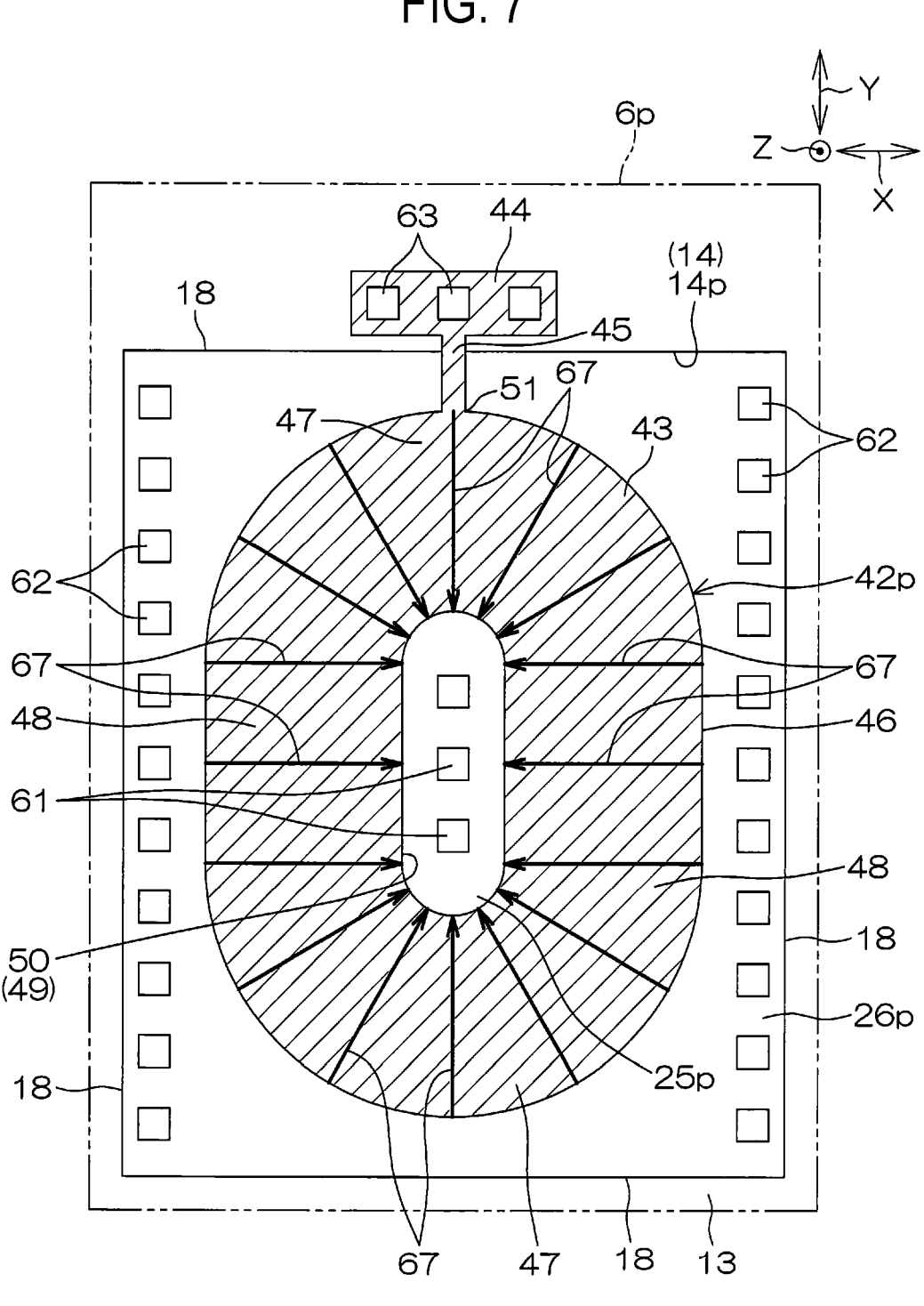
FIG. 7 is a view for explaining a process of forming a channel of the semiconductor device according to the first embodiment of the present disclosure.
Figure 8:
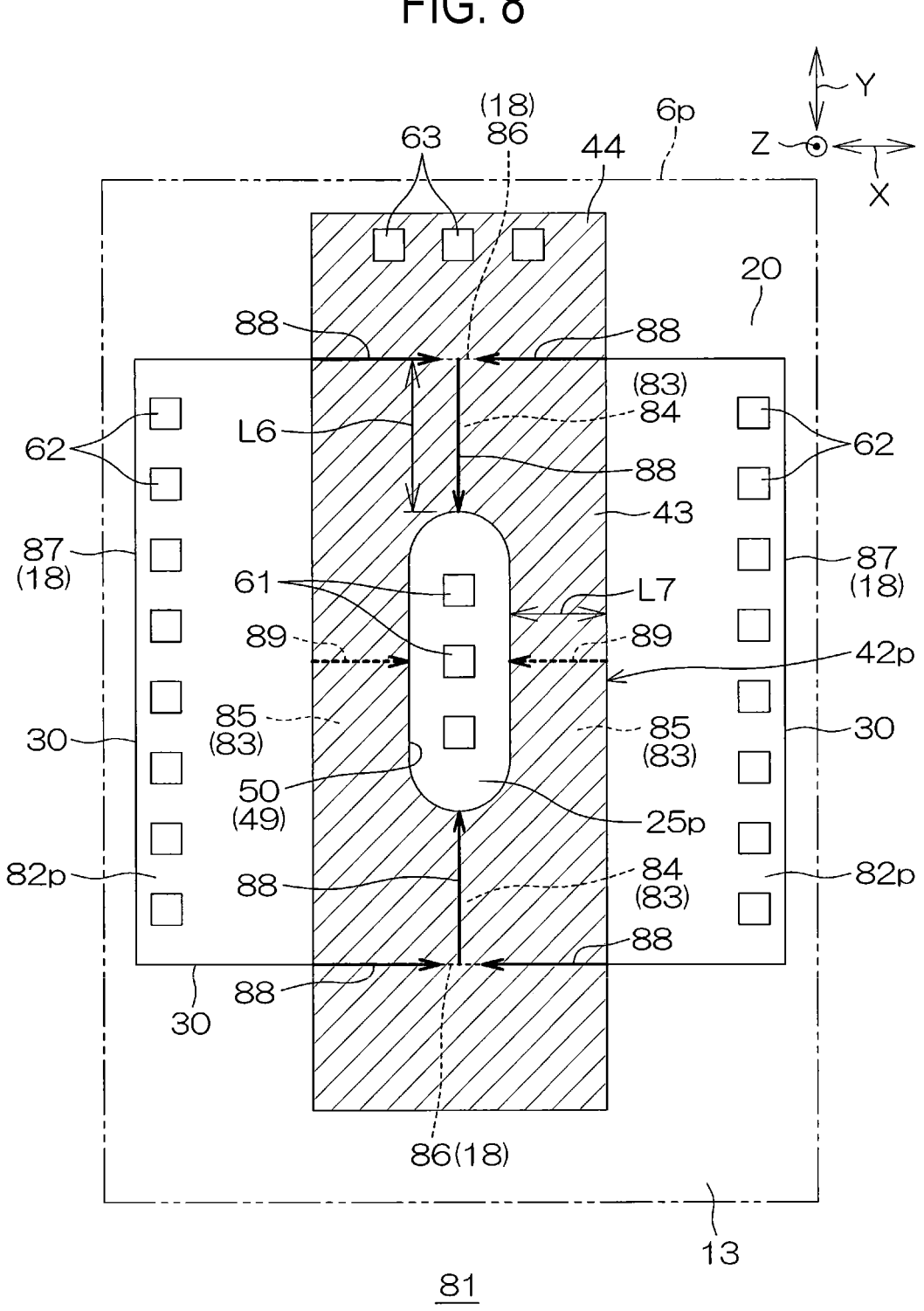
FIG. 8 is a view for explaining a process of forming a channel of a semiconductor device according to a second embodiment of the present disclosure.

FIG. 7 is a view for explaining a process of forming a channel of the semiconductor device 1 according to the first embodiment of the present disclosure. FIG. 8 is a view for explaining a process of forming a channel of the semiconductor device 81 according to a second embodiment of the present disclosure.

First, a configuration of the semiconductor device 81 will be described with reference to FIG. 8. Hereinafter, structures corresponding to the structures described with respect to the semiconductor device 1 are denoted by the same reference numerals, and explanation thereof will be omitted.

In the above-described semiconductor device 1, an example in which the p-type drain region 26p is formed to surround the p-type source region 25p has been described. In contrast, in the semiconductor device 81, a pair of p-type drain regions 82p that sandwiches the p-type source region 25p in the first direction X is formed. A region between the pair of p-type drain regions 82p in the first direction X is a channel region 83 consisting of a portion of the n-type well 24.

The channel region 83 may include a pair of first channel regions 84 and a pair of second channel regions 85. The pair of first channel regions 84 and the pair of second channel regions 85 are regions occupying a predetermined area of a surface layer portion of the channel region 83 and are combined to form the channel region 83. The pair of first channel regions 84 are portions of the channel region 83 formed along the first direction X and form a boundary 86 with the trench insulation structure 13. The pair of second channel regions 85 are portions of the channel region 83 formed along the second direction Y and form a boundary 87 with the p-type drain region 82p. The semiconductor device 81 is different from the semiconductor device 1, in which the boundary 18 is formed over the entire circumference by the outer peripheral edge 30 of the p-type drain region 26p, in that a portion of the boundary 18 between the trench insulation structure 13 and the p-side active region 14p is formed by the channel region 83.

In the semiconductor device 81, both end portions of the gate electrode 43 in the second direction Y are formed along the boundary 86. The gate contact portion 44 is connected to the gate electrode 43 at the boundary 86 without using the gate connection portion 45. The p-side planar gate structure 42p is formed in a substantially square annular shape in a plan view by the gate electrode 43 and the gate contact portion 44.

In the semiconductor device 81 having the above configuration, the first channel region 84 forms the boundary 86 with the trench insulation structure 13. Since the boundary 86 is a portion of the boundary 18 between the trench insulation structure 13 and the p-side active region 14p, the thin film portion 55 of the gate insulating film 52 due to the recess 53 is generated as described above (see FIG. 6). Therefore, at an initial stage of voltage application to the gate electrode 43, a channel is preferentially formed in the first channel region 84 along the boundary 86. By this operation, a first current path 88 indicated by solid arrows in FIG. 8 is generated. Behind the formation of the first current path 88, a second current path 89 indicated by dashed arrows in FIG. 8 is formed in the second channel region 85 spaced apart from the boundary 86. In this configuration, a length L6 from the boundary 86 to the p-type source region 25p in the second direction Y is shorter than a length L7 from the p-type drain region 82p to the p-type source region 25p in the first direction X (L6<L7), which causes a hump phenomenon in the static characteristics of the transistor.

Figure 9:
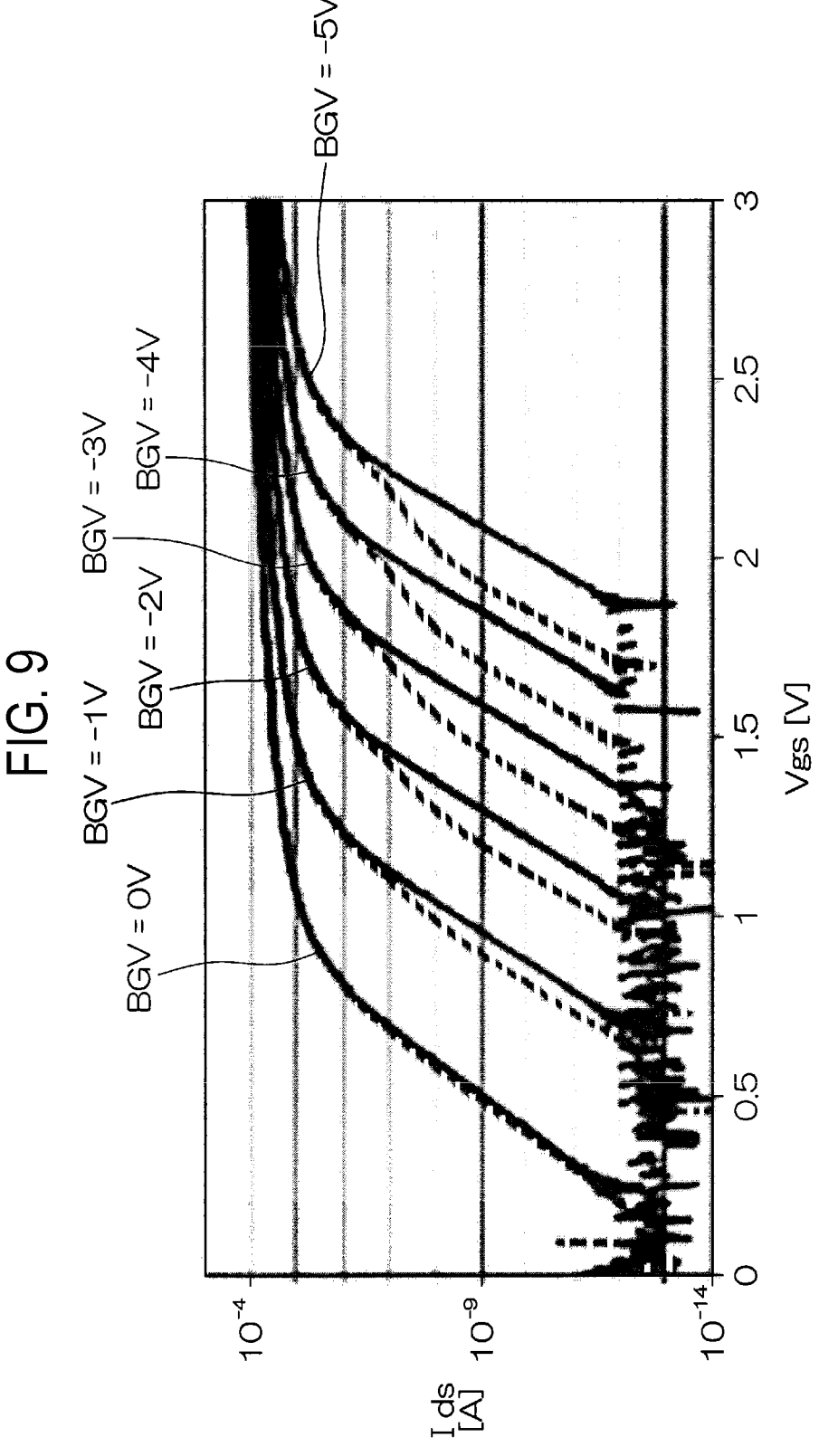
FIG. 9 is a diagram showing static characteristics of a transistor.

The hump phenomenon can be explained with reference to FIG. 9. FIG. 9 is a diagram showing an example of static characteristics of a transistor. FIG. 9 shows changes in a drain current Ids with respect to a gate voltage Vgs when a source is grounded and a drain voltage Vds=0.1 V. Dashed lines indicate characteristics when the hump phenomenon occurs, and solid lines indicate characteristics when the hump phenomenon does not occur. A plurality of characteristic curves shown in FIG. 9 indicate characteristics when a back gate voltage BGV is set to 0 V, −1 V, −2 V, −3 V, −4 V, and −5 V, respectively. From FIG. 9, it can be recognized that a tendency of the hump phenomenon becomes more conspicuous as the back gate voltage BGV becomes higher. The cause of the hump is that the thin film portion 55 (see FIG. 6) corresponding to the recess 53 is generated in a gate oxide film, and partial conduction is generated in the thin film portion 55.

Therefore, the inventor of the present application reviewed a measure to make L6>>L7 in order to suppress the hump phenomenon. By adopting L6>>L7, even when the first channel region 84 is preferentially turned on, the conduction of the first current path 88 can be delayed more than the conduction of the second current path 89. Thus, the hump characteristics can be made difficult to be exhibited. However, with this measure, since it is necessary to ensure the length L6 to be much larger than the length L7, area efficiency of the transistor is reduced.

In contrast, with the configuration of the semiconductor device 1, it is possible to prevent the hump phenomenon from occurring in drain current-gate voltage (Ids-Vgs) characteristics while avoiding the reduction in area efficiency. More specifically, referring to FIG. 7, the p-type drain region 26p surrounds the p-type source region 25p. As a result, the entire region around the p-type source region 25p can be used as a transistor channel.

A peripheral edge of the channel region 39 (in the present embodiment, an inner peripheral edge 31 of the p-type drain region 26p) is spaced apart from the trench insulation structure 13 via the p-type drain region 26p. In addition, the gate electrode 43 and the gate contact portion 44 are connected with each other by the gate connection portion 45 crossing the boundary 18. Since the gate connection portion 45 does not cover the channel region 39 and is formed on the p-type drain region 26p, the gate connection portion 45 does not serve as a gate for parasitic transistor, but serves as a resistance component of a current path from the gate contact portion 44 to the gate electrode 43. Thus, a channel is not formed immediately below the gate connection portion 45 by a voltage applied to the gate connection portion 45. Therefore, a current path 67 can be formed evenly over the entire channel region 39. As a result, it is possible to suppress occurrence of the hump phenomenon in the drain current-gate voltage (Ids-Vgs) characteristics due to, for example, the recess 53 (divot) of the trench insulation structure 13. With this configuration, it is possible to achieve good static characteristics even when the back gate voltage is increased. Therefore, the structure of the semiconductor device 1 is appropriate as a transistor structure for analog circuits to which a relatively large number of back gate voltages is applied.

For example, since the recess 53 (divot) that causes the hump phenomenon is generated by a stress from the trench insulation structure 13 (for example, STI), there are variations even within a plane of the common chip 2. Therefore, according to a layout of transistor regions, the hump phenomenon may frequently occur in some transistor regions while the hump phenomenon hardly occurs in other transistor regions. With the configuration of the semiconductor device 1, it is possible to suppress variations in occurrence of the hump phenomenon in the common chip 2, thereby improving matching characteristics of a plurality of transistors.

In addition, referring to FIG. 2, in the semiconductor device 1, the width W6 of the gate connection portion 45 is narrower than the width W1 of the p-type source region 25p, the width W4 of the gate electrode 43, and the width W5 of the gate contact portion 44. For example, the gate connection portion 45 may be formed with a minimum dimension that can be machined (a minimum dimension that can be patterned) when forming the p-side planar gate structure 42p. A portion of the p-type drain region 26p immediately below the gate connection portion 45 is a portion facing the gate connection portion 45 which is a resistance component, and thus may not be able to function sufficiently as a drain of a transistor. By making the width W6 of the gate connection portion 45 as small as possible, the influence on the p-type drain region 26p can be suppressed.

Description of Structure of Semiconductor Device 101 (Third Embodiment)

Figure 10:
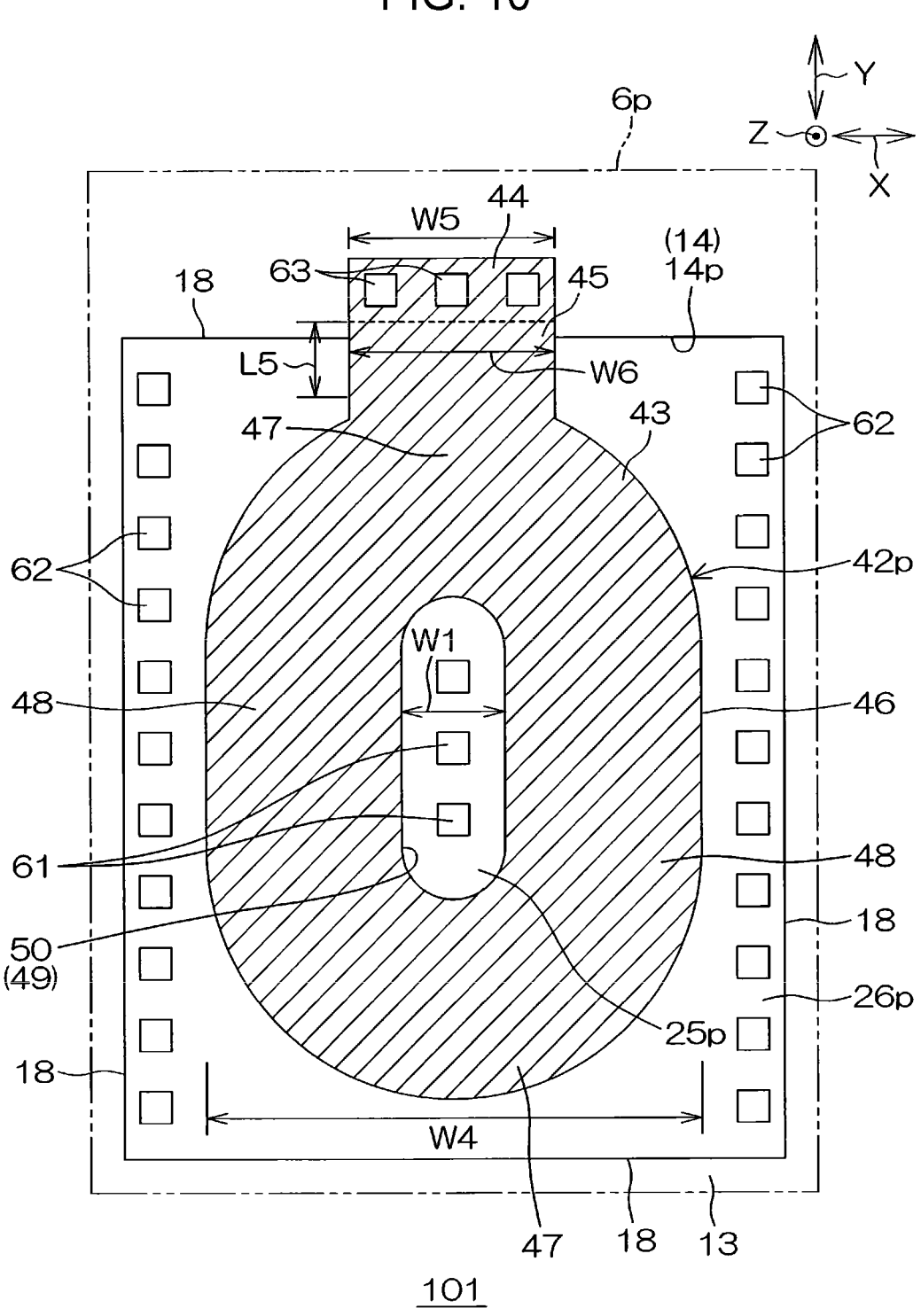
FIG. 10 is a schematic plan view showing a portion of a semiconductor device according to a third embodiment of the present disclosure.

FIG. 10 is a schematic plan view showing a portion of a semiconductor device 101 according to a third embodiment of the present disclosure. Hereinafter, structures corresponding to the structures described with respect to the semiconductor device 1 according to the first embodiment are denoted by the same reference numerals, and explanation thereof will be omitted.

In the third embodiment, the width W6 of the gate connection portion 45 is narrower than the width W4 of the gate electrode 43 and is equal to the width W5 of the gate contact portion 44.

With the semiconductor device 101 according to the third embodiment as described above, the same effects as those described with respect to the semiconductor device 1 can also be achieved. In addition, with the configuration of the semiconductor device 101, since the width W6 of the gate connection portion 45 is wider than that in the first embodiment, it is possible to suppress a voltage drop caused by the gate connection portion 45 as a resistance component.

Description of Structure of Semiconductor Device 111 (Fourth Embodiment)

Figure 11:
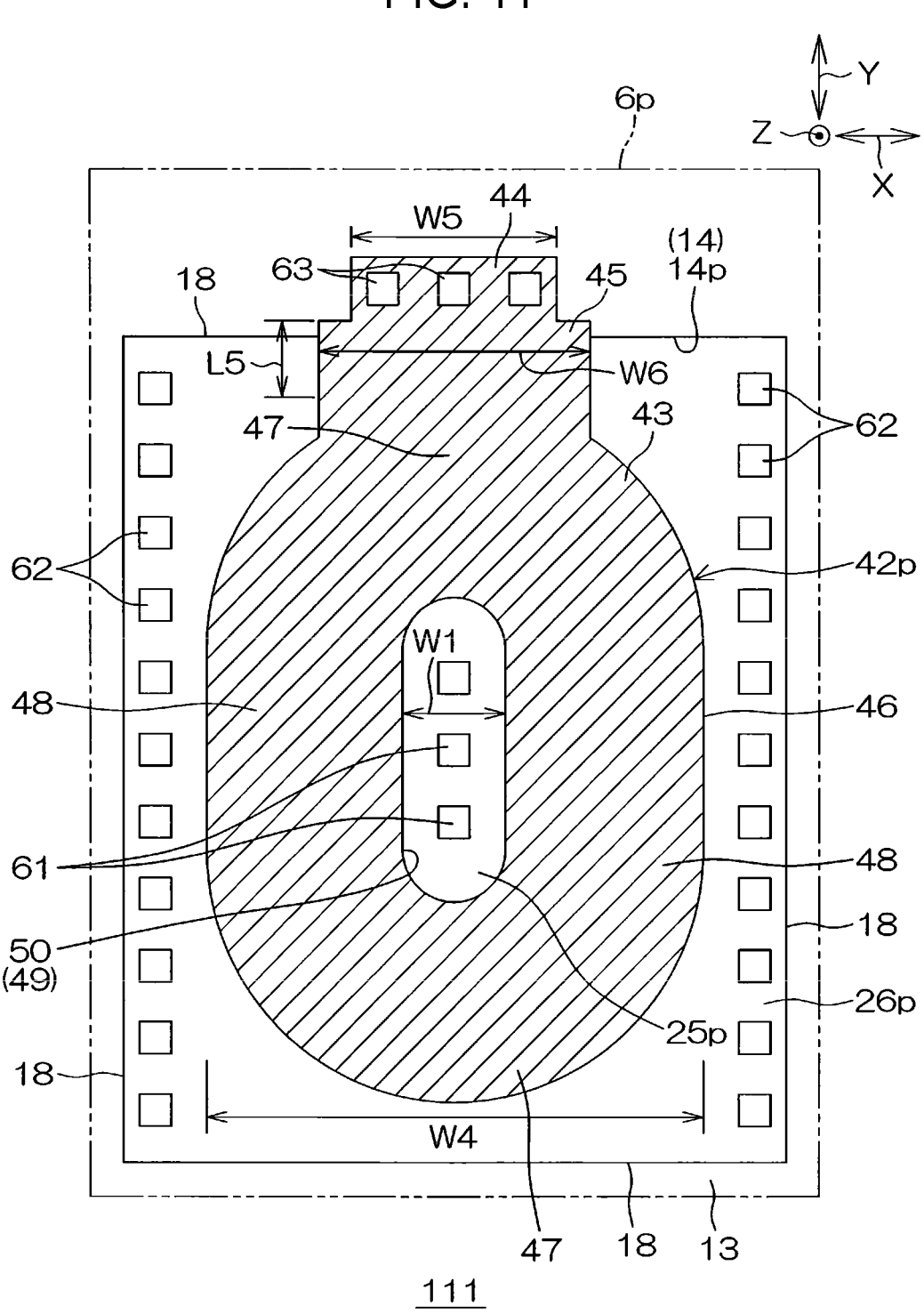
FIG. 11 is a schematic plan view showing a portion of a semiconductor device according to a fourth embodiment of the present disclosure.

FIG. 11 is a schematic plan view showing a portion of a semiconductor device 111 according to a fourth embodiment of the present disclosure. Hereinafter, structures corresponding to the structures described with respect to the semiconductor device 1 according to the first embodiment are denoted by the same reference numerals, and explanation thereof will be omitted.

In the fourth embodiment, the width W6 of the gate connection portion 45 is narrower than the width W4 of the gate electrode 43 and is wider than the width W5 of the gate contact portion 44.

With the semiconductor device 111 according to the fourth embodiment as described above, the same effects as those described with respect to the semiconductor device 1 can also be achieved. In addition, with the configuration of the semiconductor device 111, since the width W6 of the gate connection portion 45 is wider than those in the first and third embodiments, it is possible to further suppress the voltage drop caused by the gate connection portion 45 as a resistance component.

Description of Structure of Semiconductor Device
121 (Fifth Embodiment)

Figure 12:
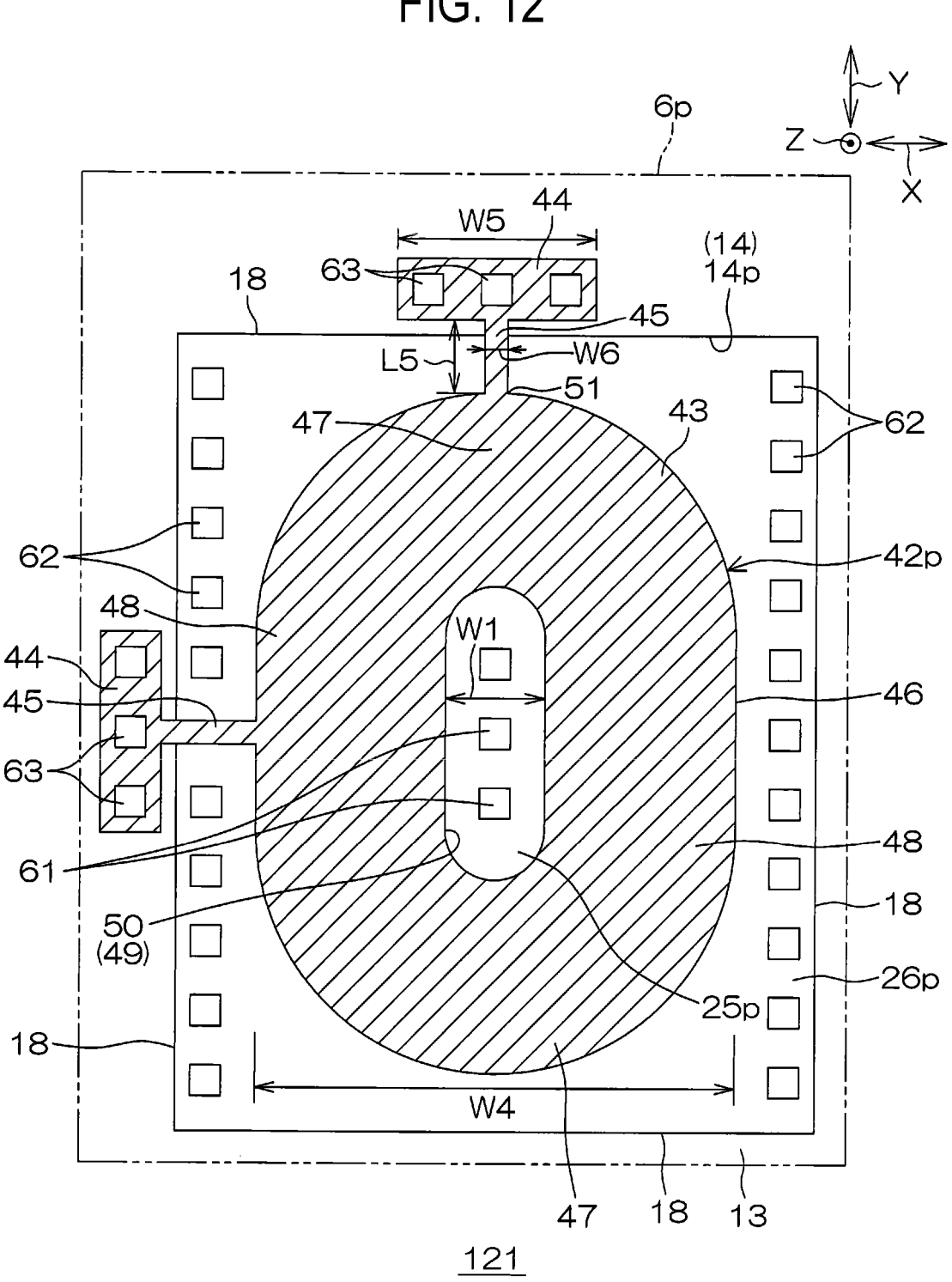
FIG. 12 is a schematic plan view showing a portion of a semiconductor device according to a fifth embodiment of the present disclosure.

FIG. 12 is a schematic plan view showing a portion of a semiconductor device 121 according to a fifth embodiment of the present disclosure. Hereinafter, structures corresponding to the structures described with respect to the semiconductor device 1 according to the first embodiment are denoted by the same reference numerals, and explanation thereof will be omitted.

In the fifth embodiment, in addition to one side of the gate electrode 43 in the second direction Y, the gate contact portion 44 is also disposed on one side of the gate electrode 43 in the first direction X. That is, a plurality of gate contact portions 44 may be provided independently from each other at a plurality of locations around the gate electrode 43. The plurality of gate contact portions 44 may be connected to the gate electrode 43 by physically independent gate connection portions 45.

With the semiconductor device 121 according to the fifth embodiment as described above, the same effects as those described with respect to the semiconductor device 1 can also be achieved. In addition, with the configuration of the semiconductor device 121, the plurality of gate contact portions 44 is provided. As a result, for example, in a case where the gate connection portions 45 are formed with the minimum machining dimension, even when machining defects occur in one gate connection portion 45 and a situation that can affect the transistor characteristics occurs, a voltage can be stably applied to the gate electrode 43 via the other gate connection portions 45.

Description of Structure of Semiconductor Device
131 (Sixth Embodiment)

Figure 13:
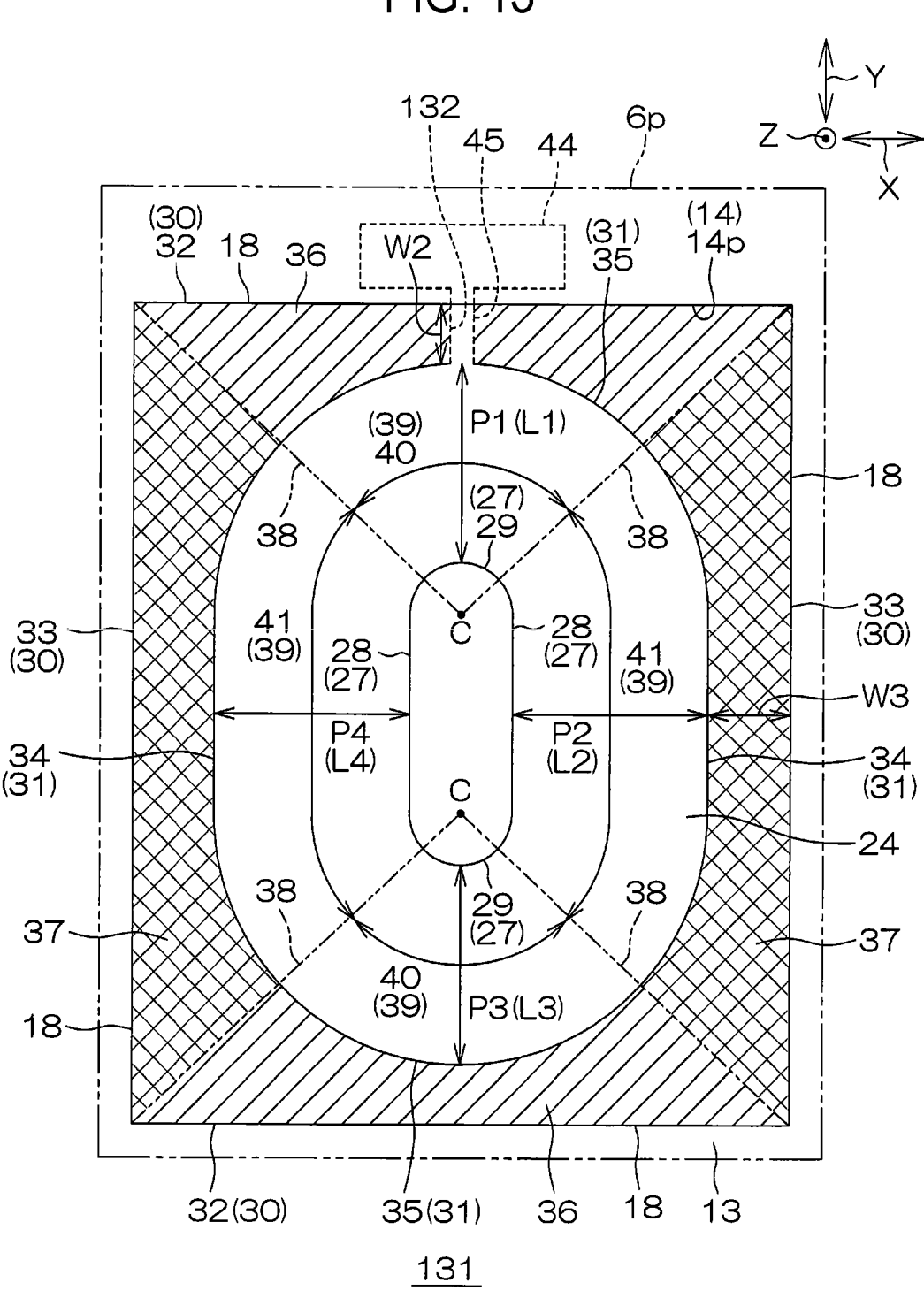
FIG. 13 is a schematic plan view showing a portion of a semiconductor device according to a sixth embodiment of the present disclosure.

FIG. 13 is a schematic plan view showing a portion of a semiconductor device 131 according to a sixth embodiment of the present disclosure. Hereinafter, structures corresponding to the structures described with respect to the semiconductor device 1 according to the first embodiment are denoted by the same reference numerals, and explanation thereof will be omitted.

In the sixth embodiment, the p-type drain region 26p is formed in an ended annular shape surrounding the p-type source region 25p in a plan view. The p-type drain region 26p surrounds the p-type source region 25p, but may be partially divided by a blank region 132 extending from the inner peripheral edge 31 toward the outer peripheral edge 30. The blank region 132 may be formed at only one location as shown in FIG. 13, or may be formed at a plurality of locations. The blank region 132 may be formed in a region immediately below the gate connection portion 45. Since a portion immediately below the gate connection portion 45 is a portion facing the gate connection portion 45 which is a resistance component, even when the p-type drain region 26p is formed, there may be a case where the p-type drain region 26p cannot sufficiently exhibit its function as a drain of a transistor.

Description of Structure of Semiconductor Device
141 (Seventh Embodiment)

Figure 14:
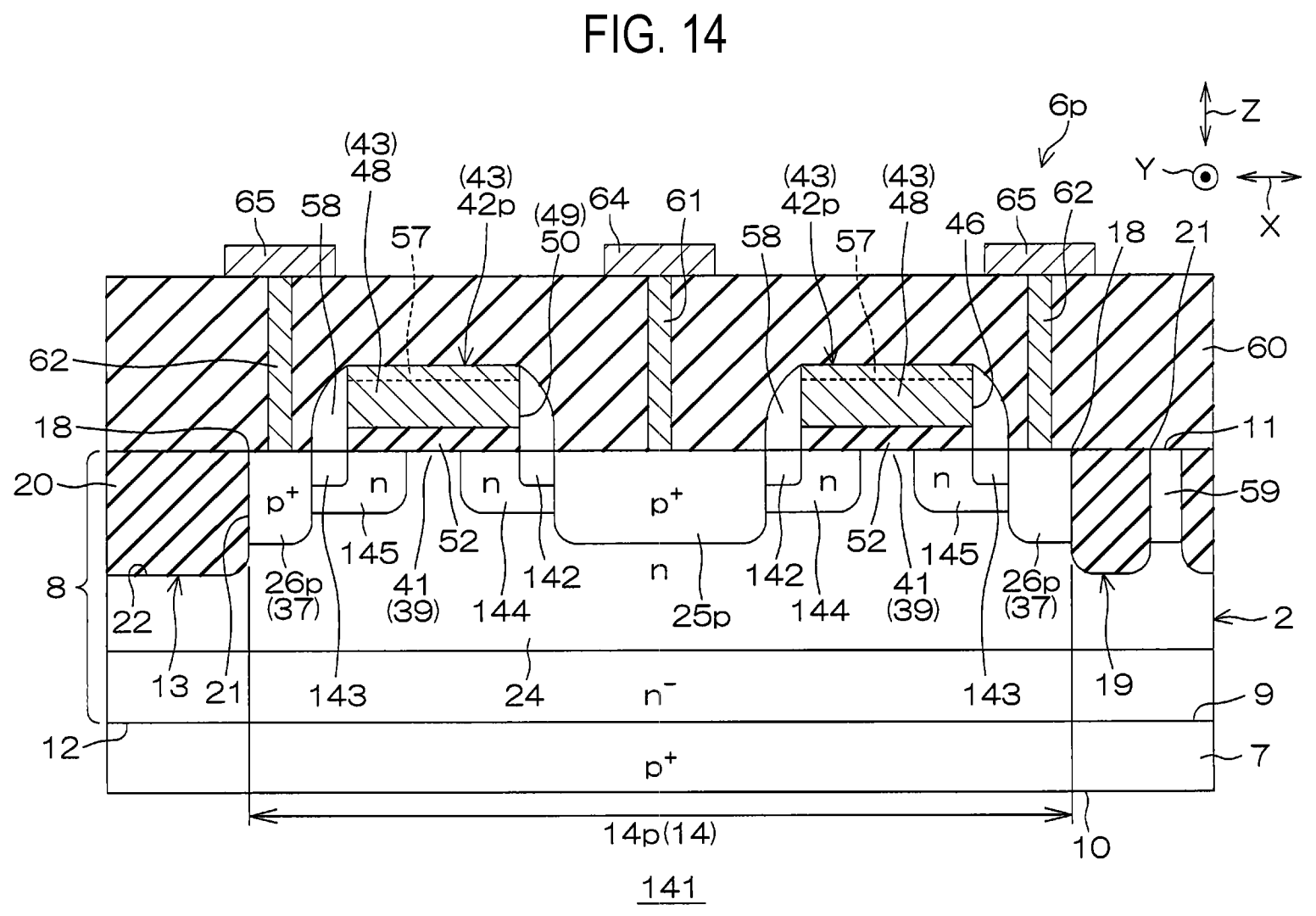

FIG. 14 is a schematic cross-sectional view showing a portion of a semiconductor device 141 according to a seventh embodiment of the present disclosure. Hereinafter, structures corresponding to the structures described with respect to the semiconductor device 1 according to the first embodiment are denoted by the same reference numerals, and explanation thereof will be omitted.

In the seventh embodiment, in the p-side active region 14p, a p-type source extension region 142 and a p-type drain extension region 143 integrally extending along the first direction X from the p-type source region 25p and the p-type drain region 26p, respectively, are formed. Impurity concentrations of the p-type source extension region 142 and the p-type drain extension region 143 may be lower than the impurity concentrations of the p-type source region 25p and the p-type drain region 26p, and may be, for example, $1.0 \times 10^{18}$ cm$^{-3}$ or more and $1.0 \times 10^{21}$ cm$^{-3}$ or less. The p-type source extension region 142 and the p-type drain extension region 143 are formed in a self-aligned manner with respect to the gate electrode 43.

In addition, in the p-side active region 14p, an n-type source pocket implantation region 144 and an n-type drain pocket implantation region 145 integrally extending along the first direction X from the p-type source region 25p and the p-type drain region 26p, respectively, are formed. Impurity concentrations of the n-type source pocket implantation region 144 and the n-type drain pocket implantation region 145 may be higher than that of the n-type well 24, and may be, for example, $1.0 \times 10^{18}$ cm$^{-3}$ or more and $1.0 \times 10^{20}$ cm$^{-3}$ or less. The n-type source pocket implantation region 144 and the n-type drain pocket implantation region 145 cross a boundary between the sidewall 58 and the gate electrode 43 along the first direction X, and face the gate electrode 43 with the gate insulating film 52 interposed therebetween.

The n-type source pocket implantation region 144 and the n-type drain pocket implantation region 145 cover bottom and side portions of the p-type source extension region 142 and the p-type drain extension region 143, respectively.

Since the p-type source region 25p and the p-type source extension region 142 are both p-type and form an integral p-type impurity region, they may be collectively and simply referred to as the p-type source region 25p. Similarly, since the p-type drain region 26p and the p-type drain extension region 143 are both p-type and form an integral p-type impurity region, they may be collectively and simply referred to as the p-type drain region 26p.

In addition, the p-type source extension region 142 and the n-type source pocket implantation region 144 that extend from the p-type source region 25p to below the gate electrode 43 may be collectively referred to as a p-side source LDD (Lightly Doped Drain) region. Similarly, the p-type drain extension region 143 and the n-type drain pocket implantation region 145 that extend from the p-type drain region 26p to below the gate electrode 43 may be collectively referred to as a p-side drain LDD (Lightly Doped Drain) region.

Although the embodiments of the present disclosure have been described, the present disclosure can also be implemented in other embodiments.

For example, in the description of the above embodiments and the accompanying drawings, n-type regions may be replaced with p-type regions, and p-type regions may be replaced with n-type regions.

As described above, the embodiments of the present disclosure are illustrative in all respects and should not be construed as limited, and are intended to include modifications in all respects.

The following features can be extracted from the description of the present disclosure and the drawings, as supplementary notes.

[Supplementary Note 1-1]

A semiconductor device (1, 101, 111, 121, 131, 141) including:

a chip (2) having a main surface (11);

a trench insulation structure (13) that defines an active region (14, 14p, 14n) in the main surface (11);

a first conductivity type well region (24) formed in the active region (14, 14p, 14n); a second conductivity type first impurity region (25p, 25n) formed in the well region (24);

a second impurity region (26p, 26n) formed in the well region (24) and surrounding the first impurity region (25p, 25n) in a plan view;

a gate electrode (43) formed on the well region (24) between the first impurity region (25p, 25n) and the second impurity region (26p, 26n), and surrounding the first impurity region (25p, 25n) in a plan view;

a gate insulating film (52) formed between the gate electrode (43) and the well region (24);

a gate contact portion (44) formed on the trench insulation structure (13); and a gate connection portion (45) that crosses the second impurity region (26p, 26n) from a boundary (18) between the trench insulation structure (13) and the active region (14, 14p, 14n) and connects the gate contact portion (44) and the gate electrode (43).

With this configuration, the second impurity region surrounds the first impurity region. Thus, it is possible to use all or substantially all around the first impurity region, as a channel of a transistor. A peripheral edge of the channel is spaced apart from the trench insulation structure via the second impurity region. As a result, it is possible to suppress the hump phenomenon due to, for example, a divot in the trench insulation structure from occurring in drain current-gate voltage (Ids-Vgs) characteristic.

[Supplementary Note 1-2]

The semiconductor device (1, 101, 111, 121, 131, 141) of Supplementary Note 1-1, wherein the second impurity region (26p, 26n) includes:

a pair of first portions (36) formed along a first direction (X) and sandwiching the first impurity region (25p, 25n) in a second direction (Y) perpendicular to the first direction (X); and a pair of second portions (37) formed along the second direction (Y) and sandwiching the first impurity region (25p, 25n) in the first direction (X).

[Supplementary Note 1-3]

The semiconductor device (1, 101, 111, 121, 131, 141) of Supplementary Note 1-2, wherein the gate connection portion (45) selectively crosses at least one of the pair of first portions (36) or the pair of second portions (37) to connect the gate contact portion (44) and the gate electrode (43).

[Supplementary Note 1-4]

The semiconductor device (1, 101, 111, 121, 131, 141) of any one of Supplementary Notes 1-1 to 1-3, wherein the well region (24) includes:

a first channel region (40) formed between the first impurity region (25p, 25n) and the pair of first portions (36) of the second impurity region (26p, 26n) and having a channel formed along the second direction (Y); and a second channel region (41) formed between the first impurity region (25p, 25n) and the pair of second portions (37) of the second impurity region (26p, 26n) and having a channel formed along the first direction (X).

[Supplementary Note 1-5]

The semiconductor device (1, 101, 111, 121, 131, 141) of Supplementary Note 1-4, wherein a length (L1, L3) of the channel in the first channel region (40) and a length (L2, L4) of the channel in the second channel region (41) are substantially equal to each other.

[Supplementary Note 1-6]

The semiconductor device (1, 101, 111, 121, 131, 141) of any one of Supplementary Notes 1-1 to 1-4, wherein the first impurity region (25p, 25n) is formed in an elongated shape in the second direction (Y), and wherein the gate electrode (43) is formed in a substantially elliptical annular shape elongated in the second direction (Y) and surrounding the first impurity region (25p, 25n).

[Supplementary Note 1-7]

The semiconductor device (1, 121, 131, 141) of any one of Supplementary Notes 1-1 to 1-6, wherein the gate connection portion (45) is formed at a location facing the first impurity region (25p, 25n) in the second direction (Y) and has a width (W6) narrower than a width of the first impurity region (25p, 25n) in the first direction (X).

[Supplementary Note 1-8]

The semiconductor device (1, 121, 131, 141) of Supplementary Note 1-7, wherein the width (W6) of the gate connection portion (45) is 0.08 μm or more and 0.3 μm or less.

[Supplementary Note 1-9]

The semiconductor device (1, 101, 111, 121, 141) of any one of Supplementary Notes 1-1 to 1-8, wherein the second impurity region (26p, 26n) is formed in an endless annular shape in a plan view.

[Supplementary Note 1-10]

The semiconductor device (1, 121, 131, 141) of any one of Supplementary Notes 1-1 to 1-3, wherein the gate connection portion (45) has a width (W6) narrower than widths of the gate electrode (43) and the gate contact portion (44) in a direction perpendicular to a direction in which the gate connection portion (45) crosses the second impurity region (26p, 26n).

[Supplementary Note 1-11]

The semiconductor device (1, 121, 131, 141) of any one of Supplementary Notes 1-1 to 1-3, wherein the gate connection portion (45) has a width (W6) narrower than a width of the first impurity region (25p, 25n) in a direction perpendicular to a direction in which the gate connection portion (45) crosses the second impurity region (26p, 26n).

[Supplementary Note 1-12]

The semiconductor device (1, 121, 131, 141) of Supplementary Note 1-10 or 1-11, wherein the width (W6) of the gate connection portion (45) is 0.08 μm or more and 0.3 μm or less.

[Supplementary Note 1-13]

The semiconductor device (1, 101, 111, 121, 131, 141) of any one of Supplementary Notes 1-1 to 1-12, wherein the trench insulation structure (13) includes a trench (19) formed in the main surface (11), an insulator (20) buried in the main surface (11) and exposing an open end portion (23) of the trench (19), and a recess (53) recessed toward a bottom wall (22) of the trench (19) at an upper end portion of the insulator (20), and wherein the gate connection portion (45) is formed to cover the recess (53).

[Supplementary Note 1-14]

The semiconductor device (1, 101, 111, 121, 131, 141) of any one of Supplementary Notes 1-1 to 1-13, wherein the first impurity region (25p, 25n) is a source region, and the second impurity region (26p, 26n) is a drain region.

[Supplementary Note 1-15]

The semiconductor device (1, 101, 111, 121, 131, 141) of Supplementary Note 1-14, wherein the active region (14, 14*p*, 14*n*) includes a CMOS region (3) for a CMOS transistor (4), and wherein the source region and the drain region are parts of the CMOS transistor (4).

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:

a chip having a main surface;

a trench insulation structure that defines an active region in the main surface;

a first conductivity type well region formed in the active region;

a second conductivity type first impurity region formed in the well region;

a second impurity region formed in the well region and surrounding the first impurity region in a plan view;

a gate electrode formed on the well region between the first impurity region and the second impurity region, and surrounding the first impurity region in a plan view;

a gate insulating film formed between the gate electrode and the well region;

a gate contact portion formed on the trench insulation structure; and a gate connection portion that crosses the second impurity region from a boundary between the trench insulation structure and the active region and connects the gate contact portion and the gate electrode, wherein in a plan view of the semiconductor device, a width of the gate connection portion is narrower than a width of the gate electrode in a first direction, which is perpendicular to a second direction in which the gate connection portion crosses the second impurity region.

2. The semiconductor device of claim 1, wherein the second impurity region includes:

a pair of first portions formed along the first direction and sandwiching the first impurity region in the second direction; and a pair of second portions formed along the second direction and sandwiching the first impurity region in the first direction.

3. The semiconductor device of claim 2, wherein the gate connection portion selectively crosses at least one of the pair of first portions or the pair of second portions to connect the gate contact portion and the gate electrode.

4. The semiconductor device of claim 2, wherein the well region includes:

a first channel region formed between the first impurity region and the pair of first portions of the second impurity region and having a channel formed along the second direction; and a second channel region formed between the first impurity region and the pair of second portions of the second impurity region and having a channel formed along the first direction.

5. The semiconductor device of claim 4, wherein a length of the channel in the first channel region and a length of the channel in the second channel region are substantially equal to each other.

6. The semiconductor device of claim 4, wherein the first impurity region is formed in an elongated shape in the second direction, and wherein the gate electrode is formed in a substantially elliptical annular shape elongated in the second direction and surrounding the first impurity region.

7. The semiconductor device of claim 6, wherein, in the plan view, the gate connection portion is formed at a location facing the first impurity region in the second direction, and the width of the gate connection portion is narrower than a width of the first impurity region in the first direction.

8. The semiconductor device of claim 7, wherein the width of the gate connection portion is 0.08 μm or more and 0.3 μm or less.

9. The semiconductor device of claim 4, wherein the second impurity region is formed in an endless annular shape in a plan view.

10. The semiconductor device of claim 1, wherein, in the plan view, the width of the gate connection portion is narrower than a width of the gate contact portion in the first direction.

11. The semiconductor device of claim 10, wherein the width of the gate connection portion is 0.08 μm or more and 0.3 μm or less.

12. The semiconductor device of claim 1, wherein, in the plan view, the width of the gate connection portion is narrower than a width of the first impurity region in the first direction.

13. The semiconductor device of claim 1, wherein the trench insulation structure includes a trench formed in the main surface, an insulator buried in the main surface and exposing an open end portion of the trench, and a recess recessed toward a bottom wall of the trench at an upper end portion of the insulator, and wherein the gate connection portion is formed to cover the recess.

14. The semiconductor device of claim 1, wherein the first impurity region is a source region, and the second impurity region is a drain region.

15. The semiconductor device of claim 14, wherein the active region includes a CMOS region for a CMOS transistor, and wherein the source region and the drain region are parts of the CMOS transistor.

* * * * *